(12) United States Patent
Harada et al.

(10) Patent No.: US 6,984,885 B1
(45) Date of Patent: Jan. 10, 2006

(54) SEMICONDUCTOR DEVICE HAVING DENSELY STACKED SEMICONDUCTOR CHIPS

(75) Inventors: Kozo Harada, Tokyo (JP); Hiroshi Sawano, Toyko (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/635,902

(22) Filed: Aug. 11, 2000

(30) Foreign Application Priority Data

Feb. 10, 2000 (JP) ............................. 2000-033790

(51) Int. Cl.
*H01L 23/48* (2006.01)
(52) U.S. Cl. .................. 257/696; 257/678; 257/700; 257/701; 257/777; 257/685; 257/686; 438/108; 438/109; 361/760
(58) Field of Classification Search ............... 257/678, 257/700, 718, 723–727, 731–733, 777, 701, 257/783, 686, 707, 685, 696; 438/108, 109; 361/760; 437/206
See application file for complete search history.

(56) References Cited

U.S. PATENT DOCUMENTS

| 4,780,098 | A | * | 10/1988 | Seidler ........................ 439/876 |
| 5,198,888 | A | * | 3/1993 | Sugano et al. ............... 257/686 |
| 5,426,072 | A | * | 6/1995 | Finnila ........................ 438/107 |
| 5,432,378 | A | * | 7/1995 | Whitney et al. ............. 257/529 |
| 5,440,452 | A | * | 8/1995 | Kitahara ..................... 361/773 |
| 5,656,856 | A | * | 8/1997 | Kweon ........................ 257/686 |
| 5,714,405 | A | * | 2/1998 | Tsubosaki et al. .......... 438/118 |
| 5,801,439 | A | * | 9/1998 | Fujisawa et al. ............ 257/686 |
| 5,818,107 | A | * | 10/1998 | Pierson et al. .............. 257/723 |
| 5,895,970 | A | * | 4/1999 | Miyoshi ..................... 257/696 |
| 5,903,437 | A | * | 5/1999 | Pierson et al. .............. 361/719 |
| 5,977,640 | A | * | 11/1999 | Bertin et al. ................ 257/777 |
| 6,002,167 | A | * | 12/1999 | Hatano et al. .............. 257/696 |
| 6,002,177 | A | * | 12/1999 | Gaynes et al. .............. 257/774 |
| 6,013,948 | A | * | 1/2000 | Akram et al. ............... 257/698 |
| 6,014,316 | A | * | 1/2000 | Eide ............................ 361/735 |
| 6,147,398 | A | * | 11/2000 | Nakazato et al. ........... 257/696 |
| 6,151,220 | A | * | 11/2000 | Sakamoto et al. .......... 361/773 |
| 6,222,212 | B1 | * | 4/2001 | Lee et al. .................... 257/207 |
| 6,252,300 | B1 | * | 6/2001 | Hsuan et al. ............... 257/686 |
| 6,261,136 | B1 | * | 7/2001 | Dennis ........................ 439/876 |
| 6,329,708 | B1 | * | 12/2001 | Komiyama ................. 257/678 |
| 6,340,845 | B1 | * | 1/2002 | Oda ............................ 257/777 |
| 6,376,769 | B1 | * | 4/2002 | Chung ........................ 174/52.2 |
| 6,376,904 | B1 | * | 4/2002 | Haba et al. ................. 257/686 |

FOREIGN PATENT DOCUMENTS

| JP | 59-222947 | | 12/1984 |
| JP | 4360595 A | * | 12/1992 |
| JP | 5-13666 | | 1/1993 |
| JP | 7-307545 | | 11/1995 |

* cited by examiner

Primary Examiner—Tom Thomas
Assistant Examiner—Chris C. Chu
(74) Attorney, Agent, or Firm—McDermott Will & Emery LLP

(57) ABSTRACT

In a semiconductor chip having electrodes formed on the top surface, and electrodes or an insulation layer formed on the back surface, the top-surface electrodes are loop-connected with the back-surface electrodes by wire bonding, or, the top-surface electrodes are connected with the back-surface electrodes or an insulation layer by conductive clip, or by deposited conductive materials. The semiconductor chips thus produced are stacked, and wires, conductive clips, or conductive materials are connected and fixed to each other to produce a stacked semiconductor device in which semiconductor chips of the same size are densely packaged. Thus, a semiconductor device is provided which enables high-density packaging of semiconductor chips even of the same size.

3 Claims, 6 Drawing Sheets

SEMICONDUCTOR DEVICE HAVING DENSELY STACKED SEMICONDUCTOR CHIPS

BACKGROUND OF THE INVENTION

1. Field of the Invention

The present invention relates to a semiconductor device having densely packaged semiconductor chips, in particular of the same size.

2. Background Art

FIG. 21 is a sectional view showing a structure of a conventional semiconductor device having stacked semiconductor chips.

A conventional method for the high-density packaging of semiconductor chips will be described below. First, on a substrate 10q provided with conductive layers 10p, the largest chip 1p among semiconductor chips to be packaged is die-bonded with on-the-chip electrodes facing up. Similarly, a semiconductor chip 1q smaller than the semiconductor chip 1p previously bonded is die-bonded on the semiconductor chip 1p. However, the semiconductor chip to be die-bonded on the underlying semiconductor chip must always be die-bonded on the space where there are no electrodes of the underlying semiconductor chip. Next, the electrodes of each of thus stacked semiconductor chips 1p and 1q are electrically connected to conductive layers 10p on the substrate 10q using wire bonding.

However, when semiconductor chips of the same size are densely mounted by a conventional method, the electrodes of an underlying semiconductor chip are always hidden by the die-bonded overlying semiconductor chip, and cannot be electrically connected to conductive layers on the substrate.

SUMMARY OF THE INVENTION

Therefore, the object of the present invention is to solve such problems of conventional methods, and to provide a semiconductor device which enables the high-density packaging of semiconductor chips even of the same size.

According to one aspect of the present invention, a semiconductor device or a semiconductor device unit comprises a semiconductor chip, at least a first electrode formed on the first major surface of the semiconductor chip, and at least a second electrode or an insulation layer formed on the second major surface opposite to the first major surface. Further; at least a conductive member is provided for connecting the first electrode with the second electrode or the insulation layer, and the conductive member is formed along the outer circumference of at least a side of the semiconductor chip.

According to another aspect of the present invention, a semiconductor device comprises a plurality of the semiconductor device units which are stacked each other, and the conductive members are connected to each other.

According to another aspect of the present invention, a semiconductor device comprises a plurality of the semiconductor device units and a packaging board for mounting the plurality of semiconductor device units. The semiconductor device units are placed on the packaging board so as to have a predetermined angle to the packaging board, and the conductive members of the semiconductor device units are connected to the packaging board.

According to another aspect of the present invention, a semiconductor device comprises a plurality of semiconductor chips each having electrodes formed on the major surface thereof, and a plurality of spacer members each having conductive pattern on the surface thereof.

The semiconductor chips and the spacer members are stacked alternately such that the electrodes of the semiconductor chips are electrically connected to the conductive patterns of the spacer members, and the conductive patterns of the spacer members are electrically connected to each other.

Other features and advantages of the invention will be apparent from the following description taken in connection with the accompanying drawings.

DETAILED DESCRIPTION OF THE PREFERRED EMBODIMENTS

Figure 1:
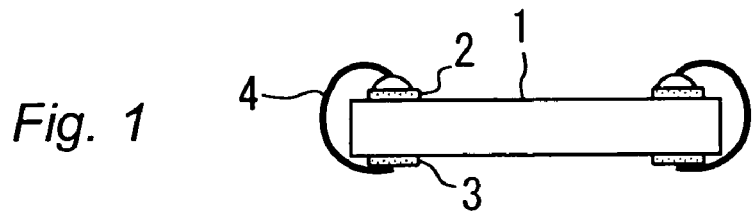
FIG. 1 is a sectional view showing a structure of a semiconductor device according to a First Embodiment of the present invention.

The embodiments of the present invention will be described below referring to the drawings. In the drawings, the same or like elements are indicated by the same symbols, and the description thereof is simplified or omitted.

First Embodiment

FIG. 1 is a sectional view showing a structure of a semiconductor device according to a First Embodiment.

In FIG. 1, reference numeral 1 indicates a semiconductor chip, 2 indicates a top-surface electrode (first electrode) formed on the top surface (first major surface) of the semiconductor chip 1, 3 indicates a back-surface electrode (second electrode) formed on the back surface (second major surface) of the semiconductor chip 1, and 4 indicates a conductive wire (conductor member) connecting the top-surface electrode 2 with the back-surface electrode 3.

The semiconductor device of this embodiment comprises a semiconductor chip 1 having electrodes 2 and 3 on the top and back surfaces, respectively, in which the top-surface electrode 2 is electrically connected with the back-surface electrode 3 by wire bonding.

This semiconductor device is produced by bonding an end of the conductive wire 4 to the top-surface electrode 2, inverting the semiconductor chip 1 upside down, and bonding the other end of the conductive wire 4 to the back-surface electrode 3.

In the semiconductor device according to this embodiment, as FIG. 1 shows, first electrodes are formed on the top surface (first major surface) of a semiconductor chip, second electrodes are formed on the back surface (second major surface) opposite to the first major surface, and conductive members for connecting the first electrodes with the second electrodes are formed along the outer circumference of the sides of the semiconductor chip.

In other words, as FIG. 1 shows, in a semiconductor chip having electrodes formed on top and back surfaces, the top-surface electrodes are loop-connected with the back-surface electrodes by wire bonding.

The semiconductor device having such a structure enables high-density packaging by stacking even if the semiconductor chips have the same size.

Second Embodiment

Figure 2:
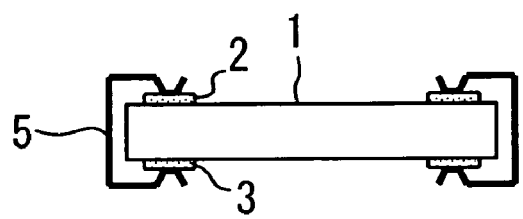
FIGS. 2 and 3 are sectional views showing structures of semiconductor devices according to a Second Embodiment of the present invention.
Figure 3:
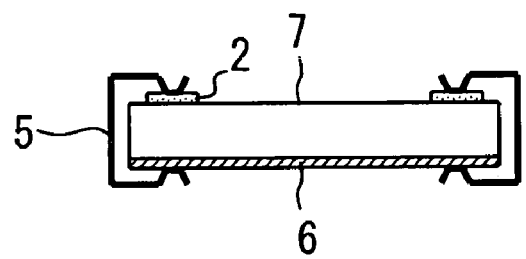

FIGS. 2 and 3 are sectional views showing structures of semiconductor devices according to a Second Embodiment.

In FIGS. 2 and 3, reference numeral 5 indicates a conductive clip having elasticity for clamping objects, 6 indicates an insulation layer provided by a surface insulation treatment, and 7 indicates a semiconductor chip having the insulation layer 6.

One of the semiconductor device of this embodiment comprises a semiconductor chip 1 having electrodes 2 and 3 on the top and back surfaces, respectively, and is provided with conductive clips 5 such that an end thereof contacts with the top-surface electrodes 2 and the other end contacts with the back-surface electrodes 3, and the connection of top- and back-surface electrodes 2 and 3 is retained by the elasticity thereof as FIG. 2 shows.

Alternatively, as FIG. 3 shows, another one of the semiconductor device of this embodiment comprises a semiconductor chip 7 having top-surface electrodes 2 and an insulation layer 6 insulation-treated and formed on the back surface, respectively, and is provided with conductive clips 5 such that an end thereof contacts with the top-surface electrodes 2 and the other end contacts with the insulation layer 6, and the holding is retained by the elasticity thereof.

In other words, one of the semiconductor devices according to this embodiment comprises a semiconductor chip 1 provided with electrodes 2 and 3 on the top and back surfaces, respectively, in which the top-surface electrode 2 is electrically connected with the back-surface electrode 3 by a conductive clip 5 as FIG. 2 shows. Alternatively, as FIG. 3 shows, another one of the semiconductor devices of this embodiment comprises a semiconductor chip 7 having electrodes 2 provided on the top surface and an insulation layer 6 insulation-treated and provided on the back surface, in which the top-surface electrode 2 and the insulation layer 6 on the back surface are clipped together by a conductive clip 5.

The semiconductor device having such a structure enables high-density packaging by stacking even if the semiconductor chips have the same size.

Third Embodiment

Figure 4:
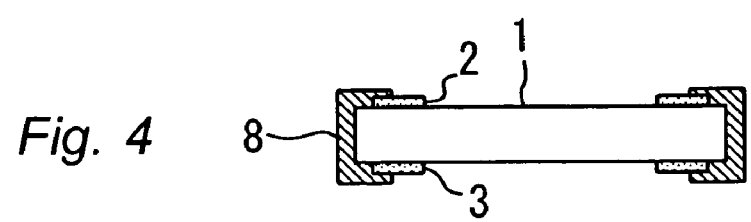
FIGS. 4 and 5 are sectional views showing structures of semiconductor devices according to a Third Embodiment of the present invention.
Figure 5:
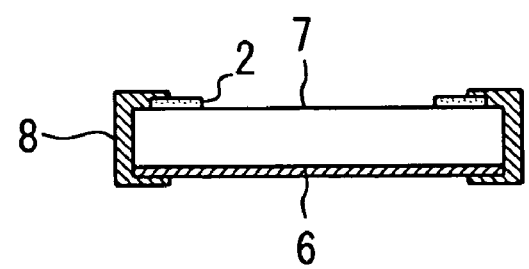

FIGS. 4 and 5 are sectional views showing structures of semiconductor devices according to a Third Embodiment.

In FIGS. 4 and 5, reference numeral 8 indicates a conductive material injection-molded over the surfaces of the semiconductor chip 1, 7.

One of the semiconductor device according to this embodiment comprises a semiconductor chip 1 provided with electrodes 2 and 3 on the top and back surfaces, respectively, in which a conductive material 8 is injection-molded over the area from the top-surface electrodes 2 to the back-surface electrodes 3, as FIG. 4 shows.

Alternatively, as FIG. 5 shows, the other of the semiconductor device of this embodiment comprises a semiconductor chip 7 having electrodes 2 provided on the top surface and an insulation layer 6 provided on the back surface, in which a conductive material 8 is formed by injection molding or the like method over the area from the top-surface electrodes 2 to the insulation layer 6.

In other words, one of the semiconductor devices according to this embodiment comprises a semiconductor chip 1 provided with electrodes 2 and 3 on the top and back surfaces, respectively, in which the top-surface electrode 2 is electrically connected with the back-surface electrode 3 by injection-molding a conductive material as FIG. 4 shows. Alternatively, as FIG. 5 shows, the other of the semiconductor devices of this embodiment comprises a semiconductor chip 7 having electrodes 2 provided on the top surface and an insulation layer 6 insulation-treated and provided on the back surface, in which the top-surface electrode 2 and the insulation layer on the back surface are covered by injection-molded conductive material.

The semiconductor device having such a structure enables high-density packaging by stacking even if the semiconductor chips have the same size.

Fourth Embodiment

Figure 6:
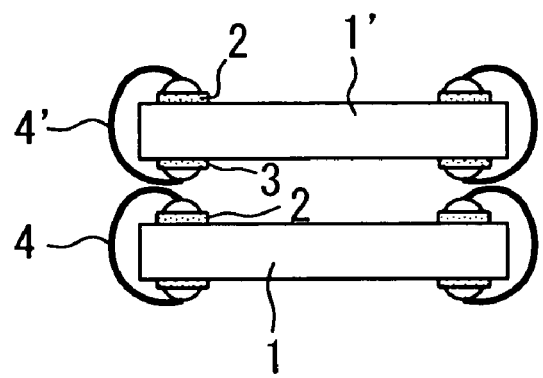
FIGS. 6 and 7 are sectional views showing structures of semiconductor devices according to a Fourth Embodiment of the present invention.
Figure 7:
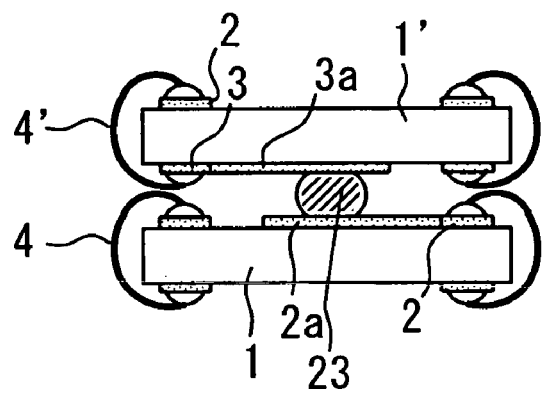

FIGS. 6 and 7 are sectional views showing structures of semiconductor devices according to a Fourth Embodiment.

In FIGS. 6 and 7, reference numeral 1 indicates one of stacked semiconductor chips, reference numeral 1' indicates the other of stacked semiconductor chips, reference numeral 4 indicates one of conductive members, and reference numeral 4' indicates the other of conductive members. In FIG. 7, reference numeral 2a indicates a first wiring pattern drawn from the top-surface electrode (first electrode) 2, reference numeral 3a indicates a second wiring pattern drawn from the back-surface electrode (second electrode) 3, and reference numeral 23 indicates a bump. A unit comprising a semiconductor chip 1, surface electrodes 2, 3 or an insulation layer 6, and conductive member 4 is named as a semiconductor device unit in this embodiment.

One of the semiconductor devices of this embodiment is constituted, as FIG. 6 shows, by stacking at least two semiconductor chips or semiconductor device units described referring to FIG. 1, and by contacting the conductive wires 4, which is connected to the top-surface electrodes 2 of the underlying semiconductor chip 1, with the conductive wires 4', which is connected to the back-surface electrodes 3 of the overlying semiconductor chip 1'. The conductive wires 4 and 4' may be joined by solder or the like.

Alternatively, as FIG. 7 shows, the semiconductor device of this embodiment is constituted, by stacking at least two semiconductor chips or semiconductor device units described referring to FIG. 1, and connecting the wiring pattern 2a, which extends from the top-surface electrodes 2 of the underlying semiconductor chip 1, to the wiring pattern 3a, which extends from the back-surface electrodes 3 of the overlying semiconductor chip 1', by means of a bump 23.

In other words, one of the stacked semiconductor devices according to this embodiment comprises, as FIG. 6 shows, a plurality of stacked semiconductor chips 1, 1', wherein a semiconductor chips 1' is stacked on a semiconductor chip 1'. Each of the semiconductor chips 1, 1' has top-surface electrodes (first electrodes) 2 on the top surface (first major surface), and back-surface electrodes (second electrodes) 3 on the back surface (second major surface) opposite to the top surface (first major surface). Each of the semiconductor chips 1, 1' has the conductive members 4, 4' for connecting the top-surface electrodes 2 with the back-surface electrodes 3 along the outer circumstance of the sides of the semiconductor chips 1, 1' respectively. The upper semiconductor chip 1' is so positioned on the lower semiconductor chip 1 that the back-surface electrodes 3 of the upper semiconductor chip 1' faces the top-surface electrodes 2 of the lower semiconductor chip 1. The conductive members 4, 4' of the semiconductor chips 1, 1' adjacent to each other are electrically and mechanically connected.

Another stacked semiconductor device according to this embodiment comprises, as FIG. 7 shows, a lower semiconductor chip 1 having a first wiring pattern 2a drawn from the top-surface electrodes (first electrodes) 2, and a upper semiconductor chip 1' having a second wiring pattern 3a drawn from the back-surface electrodes (second electrodes) 3, and a bump 23 is provided between the first wiring pattern 2a and the second wiring pattern 3a for electrically connecting the both wiring patterns.

Still in other words, one of the stacked semiconductor device of this embodiment comprises, as FIG. 6 shows, semiconductor chips 1, 1' in the stacked structure. Each of the semiconductor chips 1, 1' has electrodes 2, 3 on top and back surfaces, respectively, and the top-surface electrodes 2 are loop-connected with back-surface electrodes 3 by wire bonding of the conductive wires 4, 4' respectively. The mutual electrical connection is performed by connecting the conductive materials (wires) 4 and 4'. The other of the stacked semiconductor device of this embodiment comprises, as FIG. 7 shows, the stacked semiconductor chips 1, 1', in which the mutual electrical connection is performed by the conductive wires 4 and 4', and by the metal bump 23 formed between the wiring patterns 2a and 3a drawn from the electrodes 2 and 3 of the lower and upper semiconductor chips respectively.

In this way, a stacked semiconductor device can be produced by stacking semiconductor chips or semiconductor device units of the same size, and electrically connecting upper and lower semiconductor chips.

Fifth Embodiment

Figure 8:
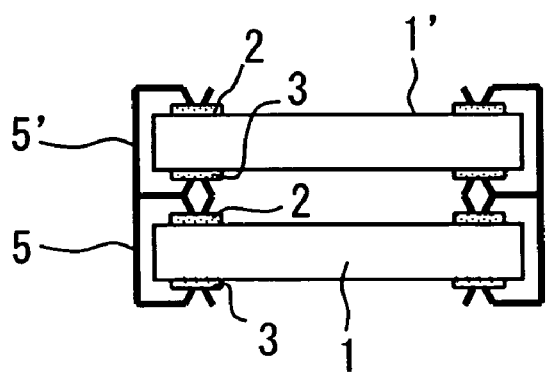
FIGS. 8 through 10 are sectional views showing structures of semiconductor devices according to a Fifth Embodiment of the present invention.
Figure 9:
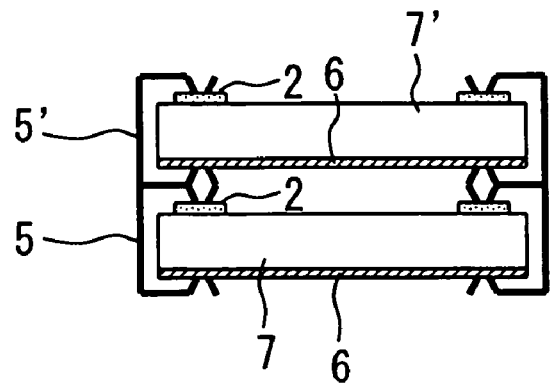
Figure 10:
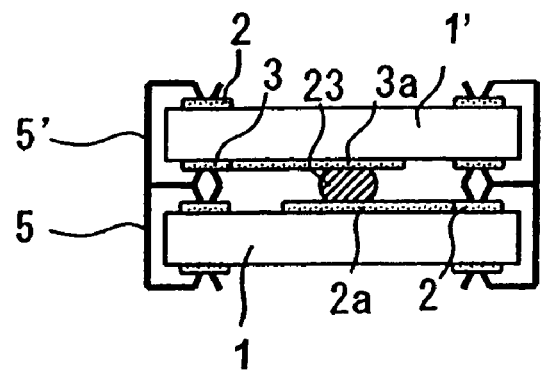

FIGS. 8 through 10 are sectional views showing structures of semiconductor devices according to a Fifth Embodiment.

In FIGS. 8 through 10, reference numeral 5 indicates a conductive clip, 5' indicates another conductive clip, 7 indicates one of stacked semiconductor chips, and 7' indicates the other of stacked semiconductor chips. A unit comprising a semiconductor chip 1, 7, surface electrodes 2, 3 or an insulation layer 6, and clip 5 is named as a semiconductor device unit in this embodiment.

The semiconductor device of this embodiment is constituted, as FIG. 8 shows, by stacking at least two semiconductor chips 1, 1' or semiconductor device units described referring to FIG. 2, and by contacting the conductive clip 5, which is provided on the underlying semiconductor chip 1, with the conductive clip 5', which is provided on the overlying semiconductor chip 1'. The conductive clips 5 and 5' may be metal joined by solder or the like.

As another example, as FIG. 9 shows, the semiconductor device of this embodiment is constituted by stacking at least two semiconductor chips or semiconductor device units described referring to FIG. 3, and by contacting the conductive clip 5 provided on the underlying semiconductor chip 7 to the conductive clip 5' provided on the overlying semiconductor chip 7'. The conductive clips 5 and 5' may be metal joined by solder or the like.

As a further example, as FIG. 10 shows, the semiconductor device of this embodiment is constituted by stacking at least two semiconductor chips or semiconductor device units described referring to FIG. 2, and by connecting the first wiring pattern 2a, extending from the top-surface electrode 2 of the underlying semiconductor chip 1, with the second wiring pattern 3a extending from the back-surface electrode 3 of the overlying semiconductor chip 1' using a bump 23.

In other words, the stacked semiconductor device of this embodiment, as FIGS. 8 through 10 show, comprises at least two stacked semiconductor chips each having electrodes 2 formed on the top surface and electrodes 3 or insulation layers 6 formed on the back surface. Each of the top-surface electrodes 2 is connected with the back-surface electrode 3 or insulation layers 6 using conductive clips 5 or 5'. Mutual electrical connection is performed by connecting the conductive clips 5 and 5' to each other, or by using the conductive clips 5 and 5' and a metal bump 23 formed on the wiring patterns 2a and 3a drawn from electrodes 2 and 3 of the lower and upper semiconductor chips, respectively.

In this way, a stacked semiconductor device can be produced by stacking semiconductor chips of the same size, and electrically connecting upper and lower semiconductor chips.

Sixth Embodiment

Figure 11:
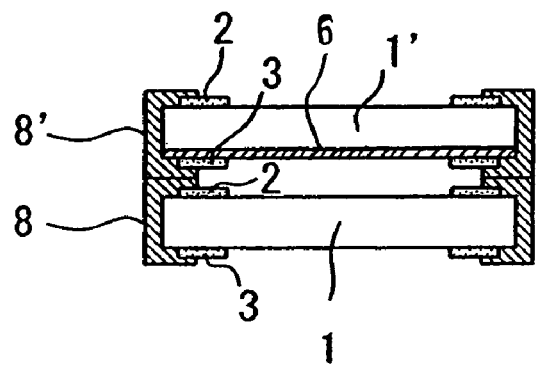
FIGS. 11 through 13 are sectional views showing structures of semiconductor devices according to a Sixth Embodiment of the present invention.
Figure 12:
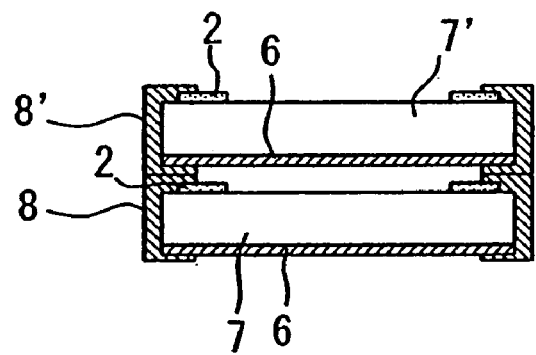
Figure 13:
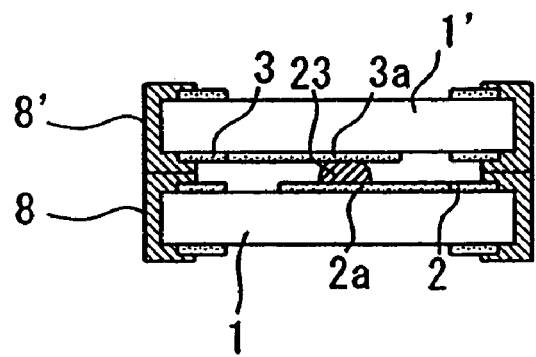

In FIGS. 11 through 13, reference numeral 8 indicates a conductive material or conductive layer, and 8' indicates another conductive material or conductive layer. A unit comprising a semiconductor chip 1, 7, surface electrodes 2, 3 or an insulation layer 6, and conductive material 8 is named as a semiconductor device unit in this embodiment.

The semiconductor device of this embodiment is constituted, as FIG. 11 shows, by stacking at least two semiconductor chips or semiconductor device units described referring to FIG. 4, and connecting injection-molded conductive materials 8 on the underlying semiconductor chip 1 with injection-molded conductive materials 8' on the overlying semiconductor chip 1'.

As another example, as FIG. 12 shows, the semiconductor device of this embodiment is constituted by stacking at least two semiconductor chips or semiconductor device units described referring to FIG. 5, and connecting injection-molded conductive materials 8 on the underlying semiconductor chip 7 with injection-molded conductive materials 8' on the overlying semiconductor chip 7'.

As a further example, as FIG. 13 shows, the semiconductor device of this embodiment is constituted by stacking at least two semiconductor chips or semiconductor device units described referring to FIG. 4, and connecting the first wiring pattern 2a extending from the top-surface electrode 2 of the underlying semiconductor chip 1 with the second wiring pattern 3a extending from the back-surface electrode 3 of the overlying semiconductor chip 1' using a bump 23.

In other words, the stacked semiconductor device of this embodiment, as FIGS. 11 through 13 show, comprises at least two semiconductor chips each having electrodes 2 and 3 formed on the top and back surfaces, respectively. Each of the top-surface electrodes 2 are connected with the back-surface electrodes 3 by injection-molded conductive materials 8 and 8'. Alternatively, the back surface is insulation-treated, and the top-surface electrodes 2 are connected with the insulation layers 6 on the back-surfaces by injection-molded conductive materials 8 and 8'. The mutual electrical connection is performed by connecting the conductive materials 8 and 8' to each other, or by using the conductive materials 8 and 8', and a metal bump 23 formed on the wiring patterns 2a and 3a drawn from electrodes 2 and 3 of the lower and upper semiconductor chips 1, 1', respectively.

In this way, a stacked semiconductor device can be produced by stacking semiconductor chips of the same size, and electrically connecting upper and lower semiconductor chips.

Seventh Embodiment

Figure 14:
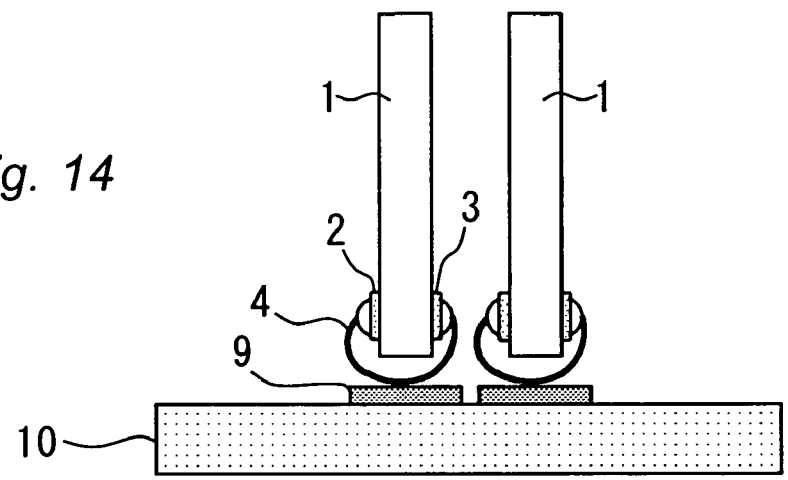
FIG. 14 is a sectional view showing a structure of a semiconductor device according to a Seventh Embodiment of the present invention.

FIG. 14 is a sectional view showing a structure of a semiconductor device according to a Seventh Embodiment.

In FIG. 14, reference numeral 9 indicates conductive patterns, and 10 indicates a packaging board. A unit comprising a semiconductor chip 1, surface electrodes 2 and 3, and conductive member 4 is named as a semiconductor device unit in this embodiment.

The semiconductor device of the present invention is constituted by providing conductive wires 4 which electrically connect the top-surface electrodes 2 with the back-surface electrodes 3 in the semiconductor device unit described referring to FIG. 1 on the one end of each of the semiconductor chips 1, placing the semiconductor chips 1 perpendicularly to the packaging board 10 having conductive patterns 9 provided on the top surface, and electrically connecting and fixing the conductive wires 4 with the conductive patterns 9 on the packaging board 10 using an adhesive or the like.

The stacked semiconductor device according to this embodiment comprises a semiconductor chips 1 having top-surface electrodes (first electrodes) 2 on the top surface (first major surface), and back-surface electrodes (second electrodes) 3 or insulation layers 6 on the back surface (second major surface) opposite to the top surface (first major surface), in which a conductive members 4 for connecting the top-surface electrodes 2 with the back-surface electrodes 3 or insulation layers 6 are formed along the outer circumstance of the sides of the semiconductor chips 1, and a packaging board 10 for mounting this semiconductor chips 1. The semiconductor chips 1 are placed on the packaging board 10 at a predetermined angle such as a right angle to the packaging board 10, and the conductive members 4 of the semiconductor chips 1 are connected to the packaging board 10.

In other words, in a semiconductor device comprising semiconductor chips 1 each having electrodes 2 and 3 on the top and back surfaces, respectively, in which the top-surface electrodes 2 are loop-connected with the back-surface electrodes 3 by wire bonding, wires 4 extended to at least a side of the chips 1 (i.e., top-back connecting terminal or connecting material) are connected to the packaging board 10.

By this, semiconductor chips 1 can be placed at a predetermined angle, such as a right angle, against the packaging board 10, and high-density packaging can be performed.

Eighth Embodiment

Figure 15:
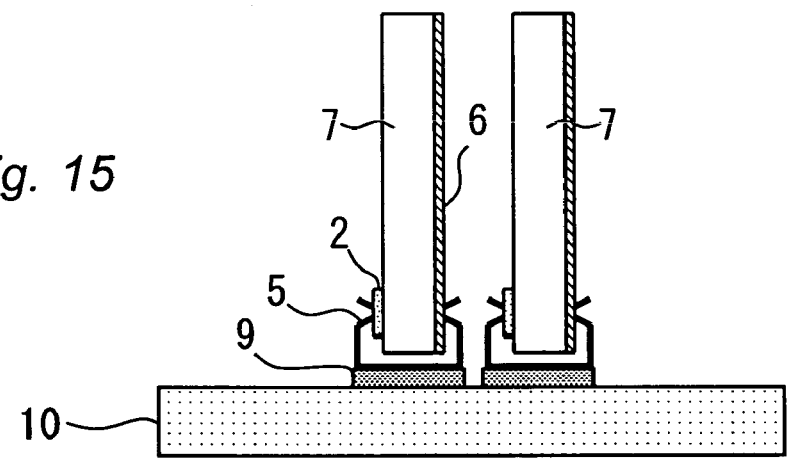
FIG. 15 is a sectional view showing a structure of a semiconductor device according to an Eighth Embodiment of the present invention.

FIG. 15 is a sectional view showing a structure of a semiconductor device according to an Eighth Embodiment. A unit comprising a semiconductor chip 7, surface electrodes 2, insulation layer 6, and clip 5 is named as a semiconductor device unit in this embodiment.

An element of the semiconductor device of this embodiment is the semiconductor device unit described referring to FIG. 3, in which conductive clips 5 clamping the top-surface electrodes 2 and the insulation layers 6 on the back surface are provided on one end of each of the semiconductor chips 7. Each of the semiconductor chips 7 has a conductive pattern 9 on the top surface, and are placed on a packaging board 10 perpendicularly to the packaging board 10, and the conductive clips 5 are electrically connected and fixed to the conductive patterns 9 on the packaging board 10.

In the semiconductor device according to this embodiment, semiconductor chips 1 have electrodes 2 and 3 on the top and back surfaces, respectively. These top-surface electrodes 2 and back-surface electrodes 3 are clamped by conductive clips 5, and the conductive clips 5 are extended to at least a side of the chips 1 (i.e., top-back connecting terminal or connecting material) are connected and fixed to the packaging board 10.

Alternatively, in the semiconductor device, the semiconductor chips 7 have top-surface electrodes 2 and insulation layers on the back surfaces which are clamped by conductive clips 5. The conductive clips 5 are extended to at least a side of the chips 1 (i.e., top-back connecting terminal or connecting material) are connected and fixed to the packaging board 10.

By this, semiconductor chips 7 can be placed at a predetermined angle, such as a right angle, against the packaging board 10, and high-density packaging can be performed.

Ninth Embodiment

Figure 16:
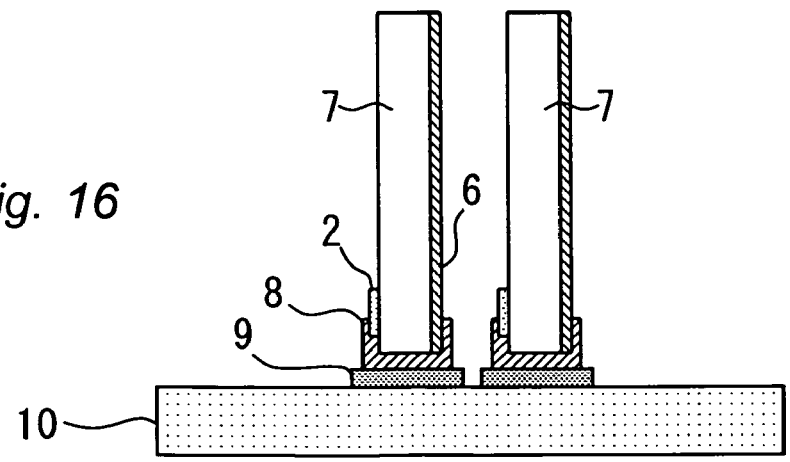
FIG. 16 is a sectional view showing a structure of a semiconductor device according to a Ninth Embodiment of the present invention.

FIG. 16 is a sectional view showing a structure of a semiconductor device according to a Ninth Embodiment. A unit comprising a semiconductor chip 7, surface electrodes 2, insulation layer 6 and conductive material 8 is named as a semiconductor device unit in this embodiment.

An element of the semiconductor device of this embodiment is the semiconductor device unit described referring to FIG. 5, in which conductive materials 8 formed over top-surface electrodes 2 and insulation layers 6 on the back surfaces are provided on one side of each of the semiconductor chips 7. The semiconductor chips 7 are placed on a packaging board 10 perpendicularly to the packaging board 10 having conductive patterns 9 on the top surface, and the conductive materials 8 are electrically connected to the conductive patterns 9 on the packaging board 10 using connecting members 9.

In the semiconductor device according to this embodiment, semiconductor chips 1 have electrodes 2 and 3 formed on the top and back surfaces, respectively, these top-surface electrodes 2 and back-surface electrodes 3 are connected by injection-molded conductive materials 8, and the conductive materials 8 formed on at least a side of the chips 1 (i.e., top-back connecting terminal or connecting material) are connected to the packaging board 10.

Alternatively, in the semiconductor device, the back surface of semiconductor chips 7 is insulation-treated, and top-surface electrodes 2 and insulation layers 6 on the back surfaces are connected by injection-molded conductive materials 8, and the conductive materials 8 formed on at least a side of the chips 7 (i.e., top-back connecting terminal or connecting material) are connected to the packaging board 10.

By this, semiconductor chips can be placed at a predetermined angle, such as a right angle, against the packaging board, and high-density packaging can be performed.

Tenth Embodiment

Figure 17:
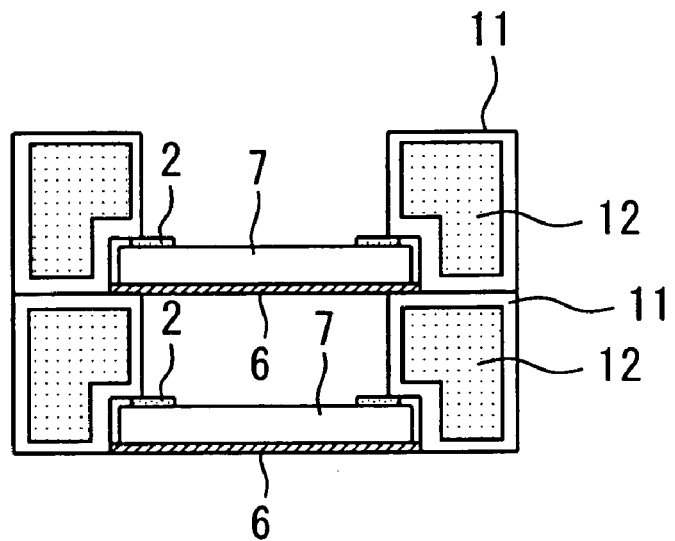
FIGS. 17 and 18 are sectional views showing the structure of a semiconductor device according to a Tenth Embodiment of the present invention.
Figure 18:
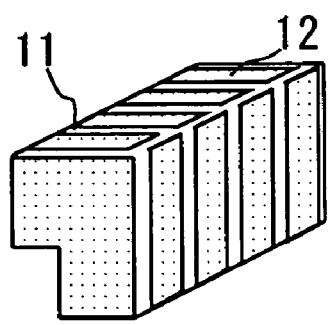

FIGS. 17 and 18 are sectional views showing the structure of a semiconductor device according to a Tenth Embodiment.

In FIGS. 17 and 18, reference numeral 11 indicates conductive patterns, and 12 indicates insulators (spacers) on which the conductive patterns 11 are formed.

The semiconductor device of this embodiment is constituted by alternately stacking at least two semiconductor chips 7 having top-surface electrodes 2 and insulation layers 6 formed on the back surface by insulation treatment, and at least two inverted-L-shaped insulators (spacers) 12 having conductive patterns 11 on the circumference thereof as FIG. 18 shows, and electrically connecting the conductive patterns 11 to the top-surface electrodes 2 on the semiconductor chips 7.

In the semiconductor device of this embodiment, a plurality of semiconductor chips 7 having electrodes 2 formed on the major surfaces, and a plurality of insulators (spacers) 12 having conductive patterns 11 on the top surfaces are alternately stacked so that the electrodes 2 of the semiconductor chips 7 are electrically connected with the conductive patterns 11 of the insulators (spacers) 12, and the conductive patterns 11 of the insulators (spacers) 12 adjacent to each other are placed so as to be electrically connected to each other.

The insulators (spacers) 12 have cavities for accommodating the end portions of the semiconductor chips 7, and are stacked so that the conductive patterns 11 of the insulators (spacers) 12 adjacent to each other are placed so as to be electrically connected to each other.

In other words, the connection between electrodes of at least two stacked semiconductor chips is achieved by inserting insulators 12 having conductive patterns (conductive wires) between the chips.

According to this embodiment, the upper and lower semiconductor chips can be electrically connected by stacking the semiconductor chips of the same size, and a stacked semiconductor device can be produced.

Eleventh Embodiment

Figure 19:
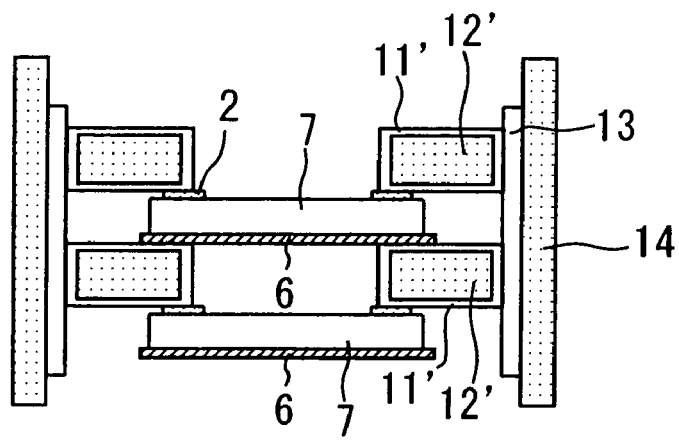
FIGS. 19 and 20 are sectional views showing a structure of a semiconductor device according to an Eleventh Embodiment of the present invention.
Figure 20:
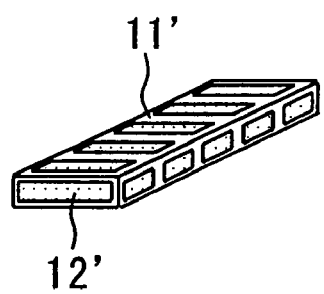
Figure 21:
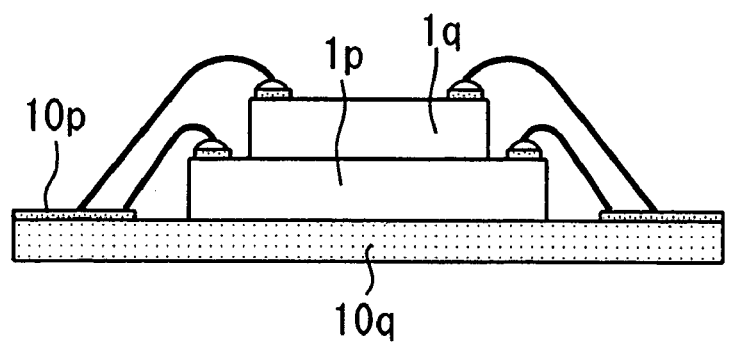
FIG. 21 is a sectional view showing a structure of a conventional semiconductor device having stacked semiconductor chips.

FIGS. 19 and 20 are sectional views showing a structure of a semiconductor device according to an Eleventh Embodiment.

In FIGS. 19 and 20, reference numeral 11' indicates other conductive patterns, 12' indicates other insulators (spacers) on which the conductive patterns 11' are formed, 13 indicates still other conductive patterns, 14 indicates boards on which the conductive patterns 13 are formed.

The semiconductor device of this embodiment is constituted by alternately imposing at least two semiconductor chips 7 having top-surface electrodes 2 and insulation layers 6 formed on the back surface by insulation treatment, and at least two insulators 12' having conductive patterns 11' formed on the circumference thereof, as FIG. 20 shows. The top-surface electrodes 2 are connected with the conductive patterns 11'. Supporting board 14 having conductive patterns 13 are provided on the both side of the stacked structure. The conductive patterns 11' on the insulators 12' are connected with with conductive patterns 13 on the substrates 14.

In the semiconductor device of this embodiment, a plurality of semiconductor chips 7 having electrodes 2 on the major surfaces, and a plurality of insulators (spacers) 12' having conductive patterns 11' on the top surfaces are alternately stacked so that the electrodes 2 of the semiconductor chips 7 are electrically connected with the conductive patterns 11' of the insulators 12', and supporting boards 14 having the conductive patterns 13 are placed so that the conductive patterns 13 of the substrate 14 make contact with the conductive patterns 11' of the insulators 12'.

In other words, the connection between electrodes of at least two stacked semiconductor chips 7 is achieved by connecting conductive patterns 11' of insulators 12' inserted between the chips with conductive patterns 13 on the supporting boards 14 provided on the both sides of the chips 7.

According to this embodiment, the upper and lower semiconductor chips can be electrically connected by stacking the semiconductor chips of the same size, and a stacked semiconductor device can be produced.

The features and the advantages of the present invention as exemplified above may be summarized as follows.

According to one aspect of the present invention, there is provided a semiconductor device comprising a semiconductor chip having electrodes formed on the top surface, and electrodes or an insulation layer on the back surface, in which the top-surface electrodes are loop-connected with the back-surface electrodes or insulation layer by wire bonding. Alternatively, there is provided a semiconductor device of which the top-surface electrodes are connected with the back-surface electrodes or insulation layer by conductive clips, or by deposited conductive materials. By this, even semiconductor chips or semiconductor device units of the same size can be stacked, and a densely packaged semiconductor device can be produced.

According to another aspect of the present invention, there is provided a densely packaged stacked semiconductor device by stacking semiconductor device units as stated above, and performing mutual electrical connection.

According to another aspect of the present invention, there is provided a densely packaged stacked semiconductor device by mounting a plurality of semiconductor device units as stated above on a packaging board perpendicularly to the packaging board.

According to still another aspect of the present invention, there is provided a densely packaged stacked semiconductor device by stacking a plurality of semiconductor chips and spacers having conductive wires on the surface, and establishing mutual connection between electrodes.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-33790, filed on Feb. 10, 2000 including specification, claims, drawings and summary, on which the Convention priority of the present application is based, are incorporated herein by reference in its entirety.

What is claimed is:

1. A semiconductor device comprising:
   a semiconductor chip;
   at least a first electrode formed on a first major surface of said semiconductor chip;
   at least a second electrode formed on a second major surface of said semiconductor chip opposite to said first major surface;
   at least a conductive member connecting said first electrode to said second electrode and covering a side surface of said semiconductor chip; and
   a conductive line pattern formed on said second major surface and extending from said second electrode, wherein said conductive line pattern is separate from said conductive member.

2. A composite semiconductor device structure, comprising at least two semiconductor devices as defined in claim 1, wherein
   said at least two semiconductor devices are stacked on each other, and
   a conductive line pattern extending from a first electrode on a first major surface of a lower one of said semiconductor devices is connected via a bump to a conductive line pattern extending from a second electrode on a second major surface of an upper one of said semiconductor devices.

3. A composite semiconductor device structure, comprising at least two semiconductor devices, wherein
   each of said semiconductor devices include:
       a semiconductor chip;
       at least a first electrode formed on a first major surface of said semiconductor chip;
       at least a second electrode formed on a second major surface of said semiconductor chip opposite to said first major surface;
       at least a conductive member connecting said first electrode to said second electrode and covering a side surface of said semiconductor chip;
   said at least two semiconductor devices are stacked on each other, and
   a conductive member of a lower one of said semiconductor devices is directly connected to a conductive member of an upper one of said semiconductor devices.

* * * * *